United States Patent
Nakamoto

(10) Patent No.: US 7,134,111 B2
(45) Date of Patent: Nov. 7, 2006

(54) LAYOUT METHOD AND APPARATUS FOR ARRANGEMENT OF A VIA OFFSET FROM A CENTER AXIS OF A CONDUCTOR AND SEMICONDUCTOR DEVICE THEREOF

(75) Inventor: Norihito Nakamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 104 days.

(21) Appl. No.: 10/849,835

(22) Filed: May 21, 2004

(65) Prior Publication Data

US 2004/0232445 A1   Nov. 25, 2004

(30) Foreign Application Priority Data

May 22, 2003   (JP)   ............... 2003-145091

(51) Int. Cl.
G06F 17/50   (2006.01)

(52) U.S. Cl. ............... 716/10; 716/4; 716/5; 716/8; 716/10; 716/11

(58) Field of Classification Search ............... 716/4, 716/5, 8, 10, 11, 12
See application file for complete search history.

(56) References Cited

U.S. PATENT DOCUMENTS

| | | | |
|---|---|---|---|
| 5,793,643 A * | 8/1998 | Cai | 716/12 |
| 6,026,224 A * | 2/2000 | Darden et al. | 716/10 |
| 6,271,548 B1 | 8/2001 | Umemoto et al. | |
| 6,275,971 B1 * | 8/2001 | Levy et al. | 716/5 |
| 6,374,395 B1 * | 4/2002 | Wang | 716/11 |
| 6,536,023 B1 * | 3/2003 | Mohan et al. | 716/5 |
| 6,732,345 B1 * | 5/2004 | Kato | 716/11 |
| 6,763,508 B1 * | 7/2004 | Igarashi et al. | 716/8 |
| 2005/0076316 A1 * | 4/2005 | Pierrat et al. | 716/4 |

FOREIGN PATENT DOCUMENTS

JP   10-056162   2/1998

* cited by examiner

Primary Examiner—A. M. Thompson
Assistant Examiner—Nelson Lam
(74) Attorney, Agent, or Firm—Foley & Lardner LLP

(57) ABSTRACT

A semiconductor device, a layout device and a layout method in which, if the size of a via interconnecting a first conductor provided in an interconnect layer and a second conductor which is provided in an interconnect layer different from the interconnect layer of the first conductor and which intersects the first conductor by solid crossing, is not less than the line width of the first conductor, and if, in case the center point of the via is arranged on a center axis along the longitudinal direction of the first conductor, the minimum spacing cannot be maintained between the first conductor and the line neighboring to the first conductor, the center of the via, arranged on the first conductor, is placed with an offset of a predetermined value with respect to the longitudinal center axis of the first conductor, so that a spacing not less than the minimum spacing is maintained between the first conductor and the line neighboring to the first conductor and in the via placement region on the first conductor.

24 Claims, 6 Drawing Sheets

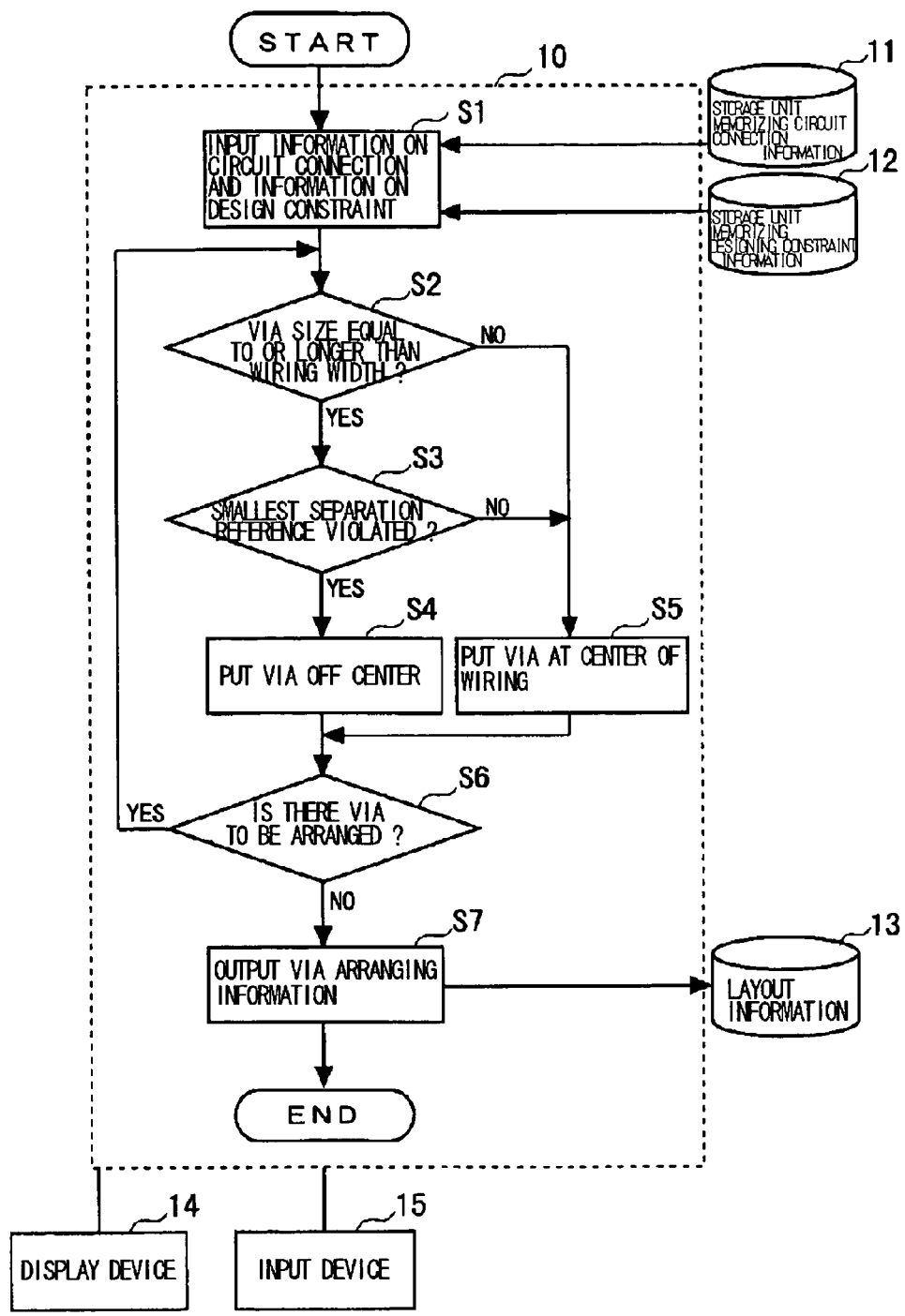

LAYOUT METHOD AND APPARATUS FOR ARRANGEMENT OF A VIA OFFSET FROM A CENTER AXIS OF A CONDUCTOR AND SEMICONDUCTOR DEVICE THEREOF

FIELD OF THE INVENTION

This invention relates to a semiconductor device and, more particularly, to a semiconductor device in which it is envisaged to optimize the connection of through-holes, a method and an apparatus for layout, and a computer program.

BACKGROUND OF THE INVENTION

In a conventional placement and routing process of a semiconductor device, such as LSI, a connection through-hole (via) formed through an inter-layer insulating film for interconnecting an upper interconnect layer and a lower interconnect layer, is placed on a centerline of a line. FIG. 6 schematically shows the layout of vias in a conventional semiconductor device. The layout pattern of a via is usually represented by a square. As shown in FIG. 6, if the size of a via 103 is smaller than or equal to the line width of a conductor (metal) 101 provided in the lower layer, interconnection may be made without affecting a neighboring routing channel 104.

With recent progress of the miniaturization process in the manufacturing process for semiconductor devices and with the improvement in the interconnect technique and step coverage, a multi-layered interconnect structure has come to be used. In a semiconductor device of the multi-layered interconnect structure, the line width in the upper interconnect layer is usually larger than that in the lower interconnect layer. In this case, design references (design rules), such as an interconnect pitch in the lower interconnect layer to which the semiconductor miniaturization process is applied cannot be directly employed in producing the via for interconnecting the upper layer line and the lower layer line and hence the via size becomes larger than the line width in the lower interconnect layer.

Meanwhile, in a masterslice semiconductor integrated circuit, in which a routing channel lattice is formed on a basic gate cell and interconnect layers are formed extending along lattice lines of the routing channel lattice, there is known a semiconductor integrated circuit in which, even if there is a marked difference between the design reference of the basic cell process and the design process of the interconnection process, attempts are made to harmonize the design references to improve the integration density (see for example the Patent Publication 1). However, with this solution, the routing channel lattice is of a non-uniform pitch.

[Patent Document 1]

Japanese Patent Kokai Publication JP-A-10-56162 (page 7 and FIG. 5)

SUMMARY OF THE DISCLOSURE

In a semiconductor device of a multi-layered interconnect structure, there are occasions where a via for interconnecting the lower interconnect layer of a narrow line width and an upper interconnect layer having a large thickness is larger in a width than the lower interconnect. That is, if a via, formed by e.g. Cu plating using the Damascene method, is provided to the lower interconnect layer of a narrow line width, the conductor that runs on the neighboring routing channel violates the minimum spacing due to the land part of the via, and hence the routing channel cannot be used, thus giving rise to difficulties in improving the interconnection efficiency. That is, if a via is provided in the pattern of the narrow line width in a lower layer for connecting the pattern of lower layer to the upper layer, it may be an occurrence that forming the pattern in the neighboring routing channel violates the design reference, as a result of which a blank routing channel may be produced or limitations may be imposed on forming the vias in the layout stage.

Accordingly, it is an object of the present invention to provide a semiconductor device, a method, apparatus and a computer program for layout improving the efficiency in interconnection and the degree of freedom in via placement.

The above and other objects are attained by a semiconductor device in accordance with one aspect of the present invention, in which if a via is of a size larger than the line width, the via is arranged so that the center point thereof is offset a preset amount from the longitudinal center axis of a conductor in question in the arrangement region of the via whereby a spacing not less than the minimum spacing is maintained between the conductor in question and a conductor routed through the neighboring routing channel. This improves the interconnection area exploitation efficiency as well as the degree of freedom in the via placement.

A method in accordance with the present invention arranges a via so that its center point is offset from the longitudinal center axis of the conductor in question. As will become apparent from the following description, the above and other objects may also be attained by an layout apparatus and a program according to the present invention in which the center point of a via is placed with an offset from the longitudinal center axis of the lower layer conductor on which said via is placed.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 3 illustrates the processing sequence of a layout apparatus according to the present invention.

PREFERRED EMBODIMENTS OF THE INVENTION

Figure 1:
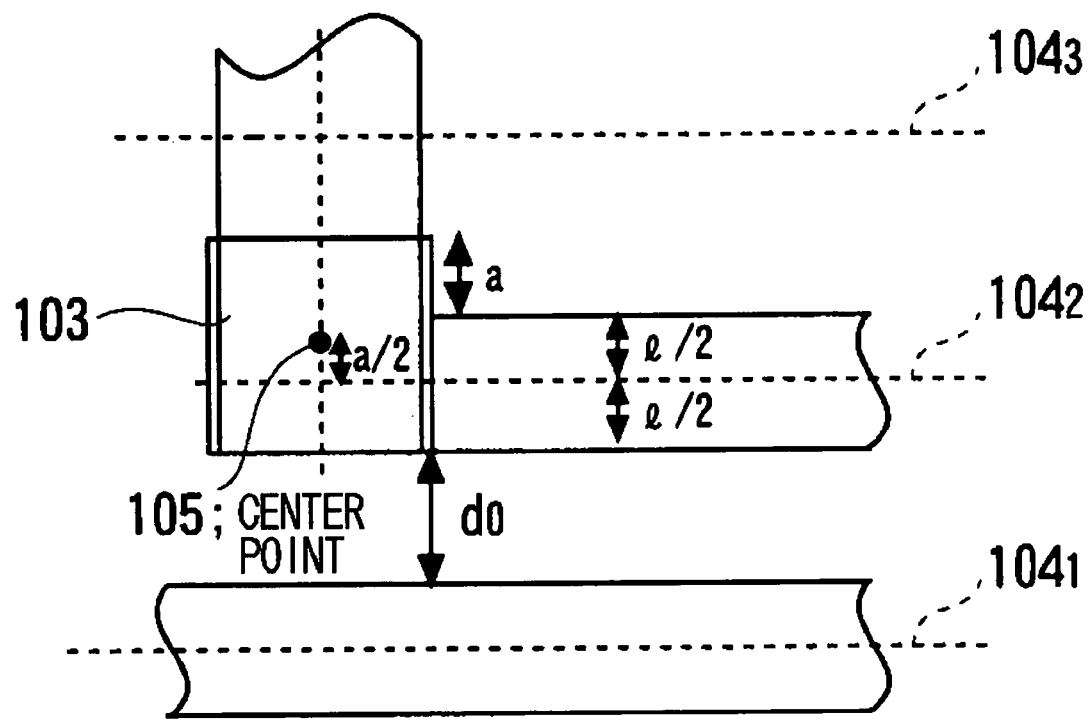
FIG. 1 illustrates an embodiment of the present invention and more specifically the layout with via placement corrected.

An embodiment of the present invention is hereinafter explained. In an embodiment of the present invention, shown in FIG. 1, a center point (105) of a connection through-hole (103) for interconnecting a first conductor (101) arranged in an interconnect layer and a second line (102) arranged in an interconnect layer different from the interconnect layer of the first conductor and intersecting the first conductor by solid crossing, is provided at a location offset a preset amount from the longitudinal center axis (104) of the first conductor (101), if the size of the via is not less than a line width of the first conductor (101) and if, in case the center of the connection through-hole (103) is arranged on the longitudinal center axis of the first conductor (101), the minimum spacing cannot be maintained between the first conductor (101) and a conductor neighboring to the first conductor (see FIG. 2). In the via placement region on the first conductor (101), a spacing not less than the minimum routing spacing is maintained between the first conductor and a conductor routed on a routing channel neighboring to the first conductor, so that a conductor may be routed on the routing channel.

In a via placement region where the minimum routing spacing cannot be secured between the first conductor (101) and the conductor neighboring to the first conductor, the center point of the via may be arranged with an offset along the direction perpendicular to the longitudinal center axis of the first conductor (101).

In the present embodiment, the first conductor (101) is provided on the lower interconnect layer and the second conductor (102) is provided on the upper interconnect layer. In the present embodiment, the first conductor (101) has a narrower line width than that of the second conductor (102).

In the present embodiment, the via placement region on the first conductor (101) may have one side edge aligned with one longitudinal side edge of the first conductor.

A method in accordance with another embodiment of the present invention, for carrying out the layout for a semiconductor device, using a computer, is hereinafter described. FIG. 3 illustrates the processing sequence for carrying out the method of the present invention, with the aid of a computer making up a design automating apparatus. Referring to FIG. 3, an illustrative processing sequence layout method according to an embodiment of the present invention is explained. The computer is a workstation including a display unit, an input device and a storage device, or a personal computer.

The information on circuit connection is read from a storage unit 11 storing the information on circuit connection, and the information on the designing constraint is read from a storage unit 12, storing the information on the designing constraint, including the line width information and the minimum spacing information (step S1).

It is then verified whether or not the size of a via, interconnecting the first conductor of an N'th interconnect layer and the second conductor of an (N+1)st interconnect layer intersecting the first conductor by solid crossing, is equal to or larger than the line width of the first conductor (step S2). If the via size is smaller than the line width of the first conductor, the via is arranged in the via placement region as usual.

In case the via size is equal to or larger than the line width of the first conductor, it is verified in a step S3 whether or not the minimum spacing between the first conductor and the conductor neighboring thereto (constraint condition) is violated if the center point of the via is arranged on the longitudinal center axis of the first conductor (step S3).

If the minimum spacing constraint condition is not violated by arranging the via center on the longitudinal center axis of the first conductor, the via center is placed on the longitudinal center axis of the first conductor as usual (step S15).

If conversely the minimum spacing constraint condition is violated, the via is provided on the via placement site on the first conductor with an offset from the longitudinal center axis of the first conductor. This procures a spacing not smaller than the minimum spacing between the first conductor inclusive of the via placement region and the conductor neighboring thereto (step S4).

Should a via(s) be provided further in similar manner (step S6), the processing of the steps S2 to S4 or S5 is repeated, and the via placement information is output to a layout information storage unit 13 (step S7). The via placement information may also be output each time the placement of a given via(s) is determined (step S4).

The layout apparatus of the present invention (designing automating apparatus) executes the above processing on a computer having a layout tool (software) installed thereon. The program according to the present invention comprises a computer program (placement-routing software) for allowing the processing of the above steps S1 to S7 of FIG. 3 to be executed on a computer.

Figure 2A:
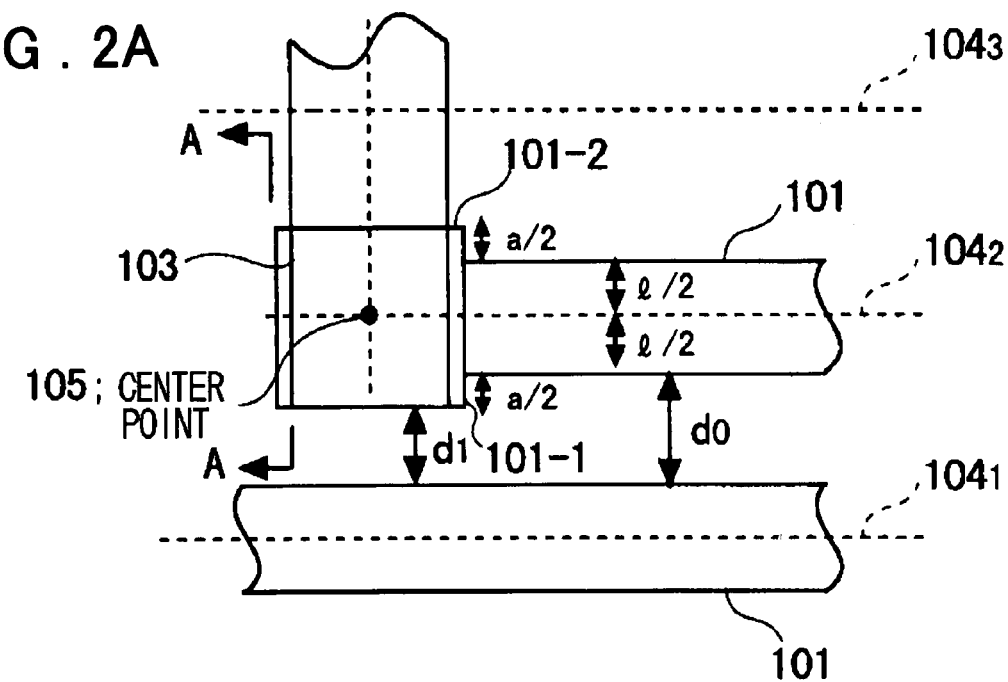
FIG. 2A illustrates the layout with via placement not as yet corrected and FIG. 2B schematically shows the cross-section taken along line A—A of FIG. 2A.
Figure 2B:
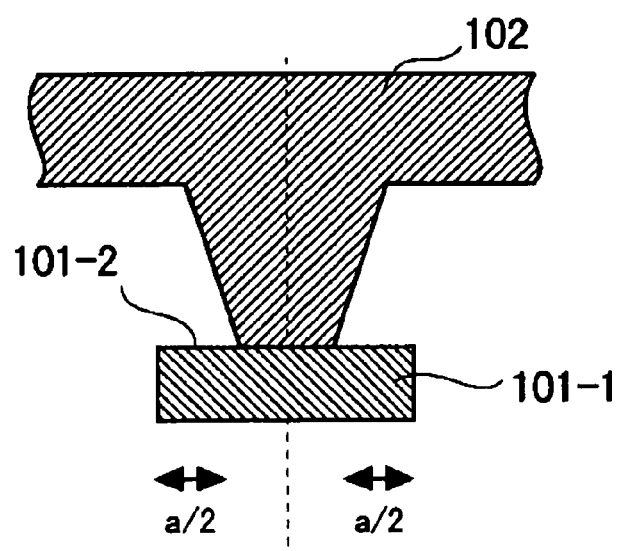
FIG. 2 illustrates an embodiment of the present invention, where

For more detailed description of the above-described preferred embodiment, a specified embodiment of the present invention is now described with reference to the drawings. FIG. 1 illustrates the layout of an embodiment of the present invention. FIG. 2A illustrates the layout prior to correction of the via placement, and FIG. 2B depicts a cross-sectional view taken along line A—A of FIG. 2A. FIG. 1 schematically shows a case in which a via is offset with respect to the layout shown in FIG. 2A. In FIGS. 1 and 2, the via layout pattern is represented by squares.

Referring to FIGS. 1 and 2A, plural routing channels 104 are arranged at a preset interval and routing is made using these routing channels. If, as a via 103 interconnecting a conductor 101 of finer line width provided in a lower metal layer (also referred to as a 'lower layer conductor') and a conductor 102 of a broader line width provided in an upper metal layer (also referred to as an 'upper layer conductor'), a via having a width broader than the line width of the conductor of the finer line width in the lower layer 101 is used, metals 101-1 and 101-2 (i.e., land edges) surrounding the via 103 are generated in the layout pattern, as shown in FIG. 2.

In order to provide a sufficient spacing, as required by the design reference, for the metals 101-1 and 101-2 surrounding the via 103, it becomes impossible to use neighboring routing channels $104_1$ and $104_3$, thus placing limitations on the routing freedom, that is, lowering the exploitation efficiency of the interconnect area. With the size of the protrusions a/2 of the metals 101-1 and 101-2, that is, with the via larger in size by a/2 on each side thereof than the width 1 of the conductor 101, the spacing between the conductor laid on the routing channel $104_1$ and the conductor 101 laid on the routing channel $104_2$ is d0-a/2, which is lesser than the minimum spacing d0, and hence the design reference for the minimum spacing is not met. Thus, if it is desired to provide the sufficient spacing with respect to the via placement region, inclusive of the metals 101-1 and 101-2 surrounding the via, which satisfies the minimum spacing constraint, the spacing corresponding to two or more routing channels is required from the routing channel $104_2$ on which the conductor is routed.

Thus, in case the via is provided at the center of the lower layer conductor 101, the protrusions of the metals 101-1 and 101-2 surrounding the via, are produced on both sides of the conductor 101, such that the conductors laid on the routing channels $104_1$ and $104_3$ violate the minimum spacing constraint and hence the routing cannot be done on both side routing channels.

In the present invention, a center point 105 of a via 103 is offset along a direction perpendicular to the longitudinal direction of the conductor 101, as shown in FIG. 1. In this figure, the center point 105 of the via 103 is offset from the longitudinal center axis of the conductor 101, along the direction perpendicular to the longitudinal direction thereof, with an offset equal to a/2, where a/2 is the length of metal protrusions 101-1 and 101-2 in FIG. 2. This eliminates the metal protrusion otherwise affecting the neighboring routing channel $104_1$. In the case of FIG. 1, the via placement region has a side edge aligned with the side edge along the longitudinal direction of the conductor 101. In this manner, on one side of the via the conductor can be laid.

With the present embodiment of the semiconductor integrated circuit of the multi-layered interconnect structure, described above, the via 103, interconnecting the lower layer conductor 101 of the narrower line width and the upper layer conductor of a larger line width, is arranged with an offset along the direction perpendicular to the routing direction of the lower layer conductor 101, whereby it is possible to eliminate the problem that, in case the via is arranged without offsetting the center point of the via, the neighboring routing channels on both sides of the via cannot be used by other conductor. The size of the via is not changed, that is, there is no change in electric characteristics, such as IR drop. It should be noted that the offsetting direction of the center point of the via does not necessarily have to be unified and may optionally be changed depending on the near-by pattern.

According to the embodiment of the present invention, it is possible to reduce the extent the neighboring routing channel is affected as a result of the increase in the via size to maintain the interconnect area exploitation efficiency. Although the case of producing the upper layer conductor (of a larger width) 102 and the via 103 by the Damascene method for Cu is schematically shown in FIG. 3, this is merely illustrative and the present invention is, of course, not to be limited to this particular producing method.

Figure 4:
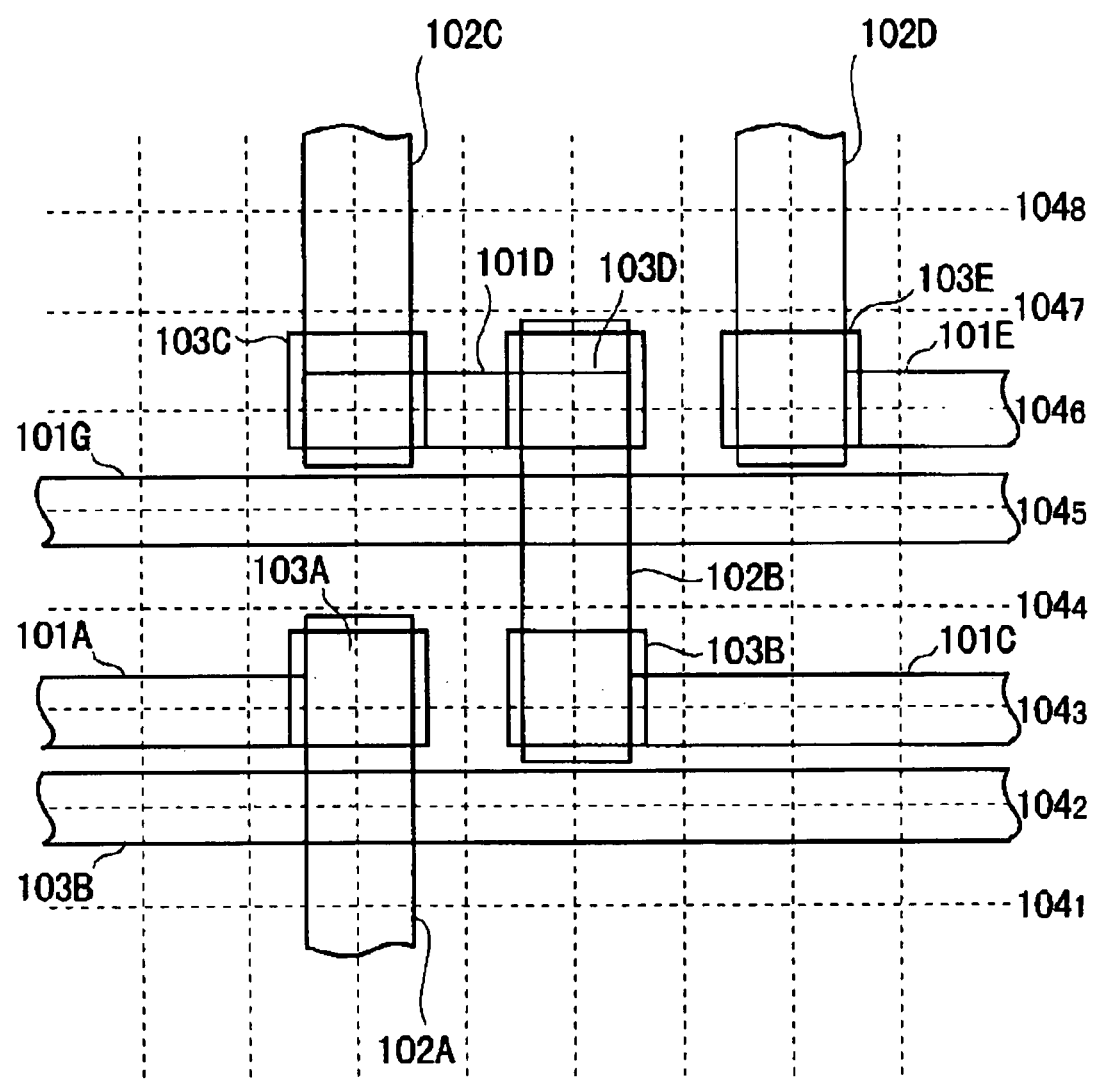
FIG. 4 shows exemplary layout embodying the present invention.

The embodiment of the present invention is now explained in comparison with a case not relevant to the present invention (comparative example). FIG. 4 illustrates an embodiment of the present invention. In FIG. 4, the lower layer conductor 101 is provided in M5 (fifth metal interconnect layer), while the upper layer conductor 102 is provided in M6 (sixth metal interconnect layer). The pitch of the routing channels 104 in the fifth interconnect layer is 0.4 µm. The line width of the lower layer conductor is 0.2 µm, with the minimum spacing reference(constraint) being 0.2 µm. The via size is 0.24 µm. Hence, a/2 of FIGS. 1 and 2 is 0.1 µm.

Referring to FIG. 4, showing a via 103A interconnecting a conductor 101A placed on the routing channel $104_3$ and an upper layer conductor 102A, the center point of the via is offset in the vertical direction in the drawing (to a position above the centerline in the longitudinal direction of the conductor 101A). In similar manner, the center point of the via 103B, interconnecting a conductor 101C on the routing channel $104_3$ of the same row and an upper layer conductor 102B, is offset in the vertical direction in the drawing (to a position above the centerline in the longitudinal direction of the conductor 101C).

With the above interconnect structure, the conductor 101B may be laid on a routing channel $104_2$, as the minimum spacing constraint is met. Moreover, the center point of a via 103C interconnecting a conductor 101D on a routing channel $104_6$ and an upper layer conductor 102C, is offset in the vertical direction (to a position above the centerline in the longitudinal direction of the conductor 101D). On the other hand, the center point of a via 103D, interconnecting a conductor 101D on the routing channel $104_6$ and an upper layer conductor 102B, and the center point of a via 103E, interconnecting a conductor 101E and an upper layer conductor 102D, are offset in the vertical direction (to a position above the centerline in the longitudinal direction of the conductors 101D, 101E). By so doing, a conductor 101G may be placed on a routing channel $104_5$, as the minimum spacing constraint is met.

Figure 5:
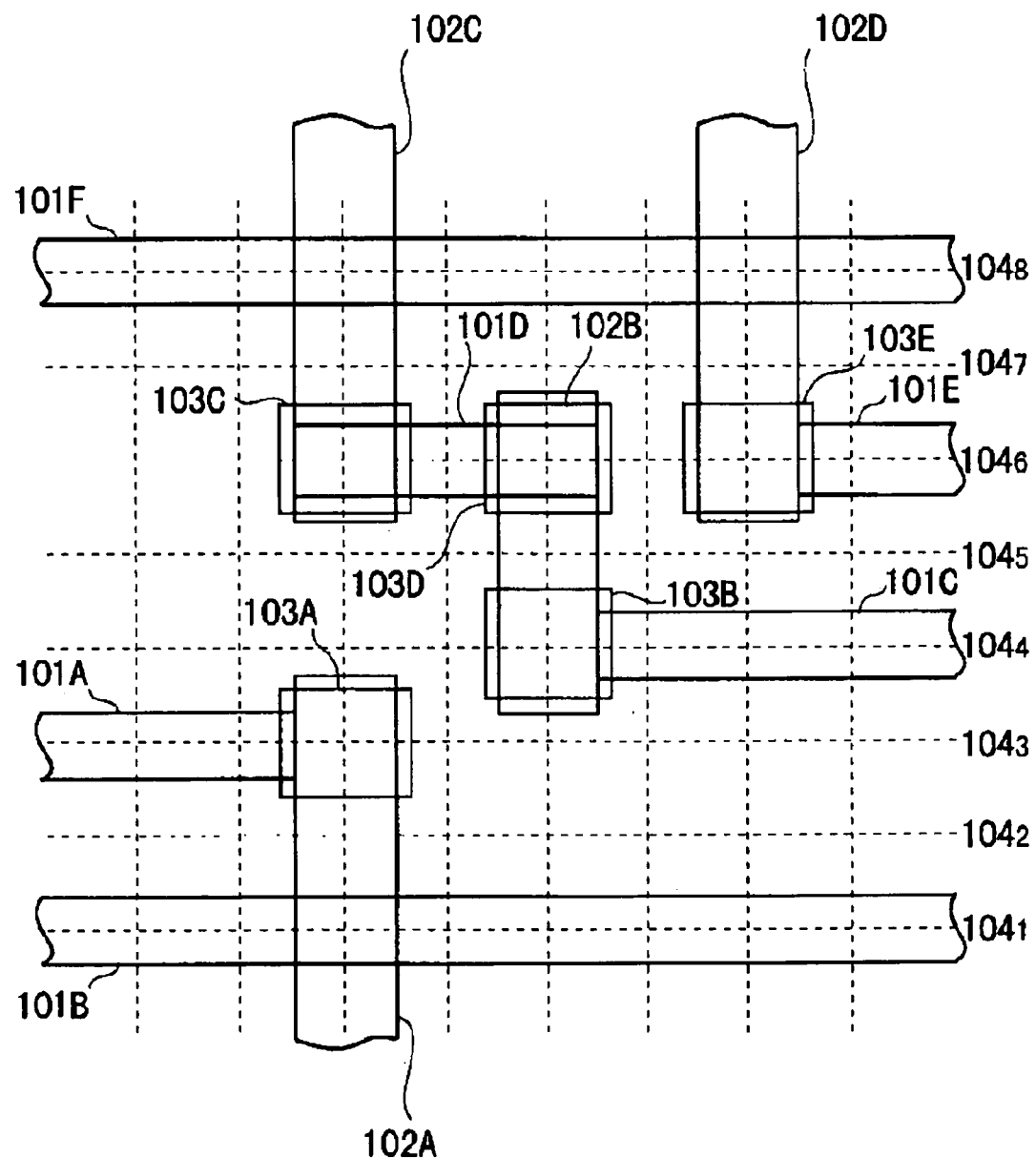
FIG. 5 shows exemplary layout of a Comparative Example.
Figure 6:
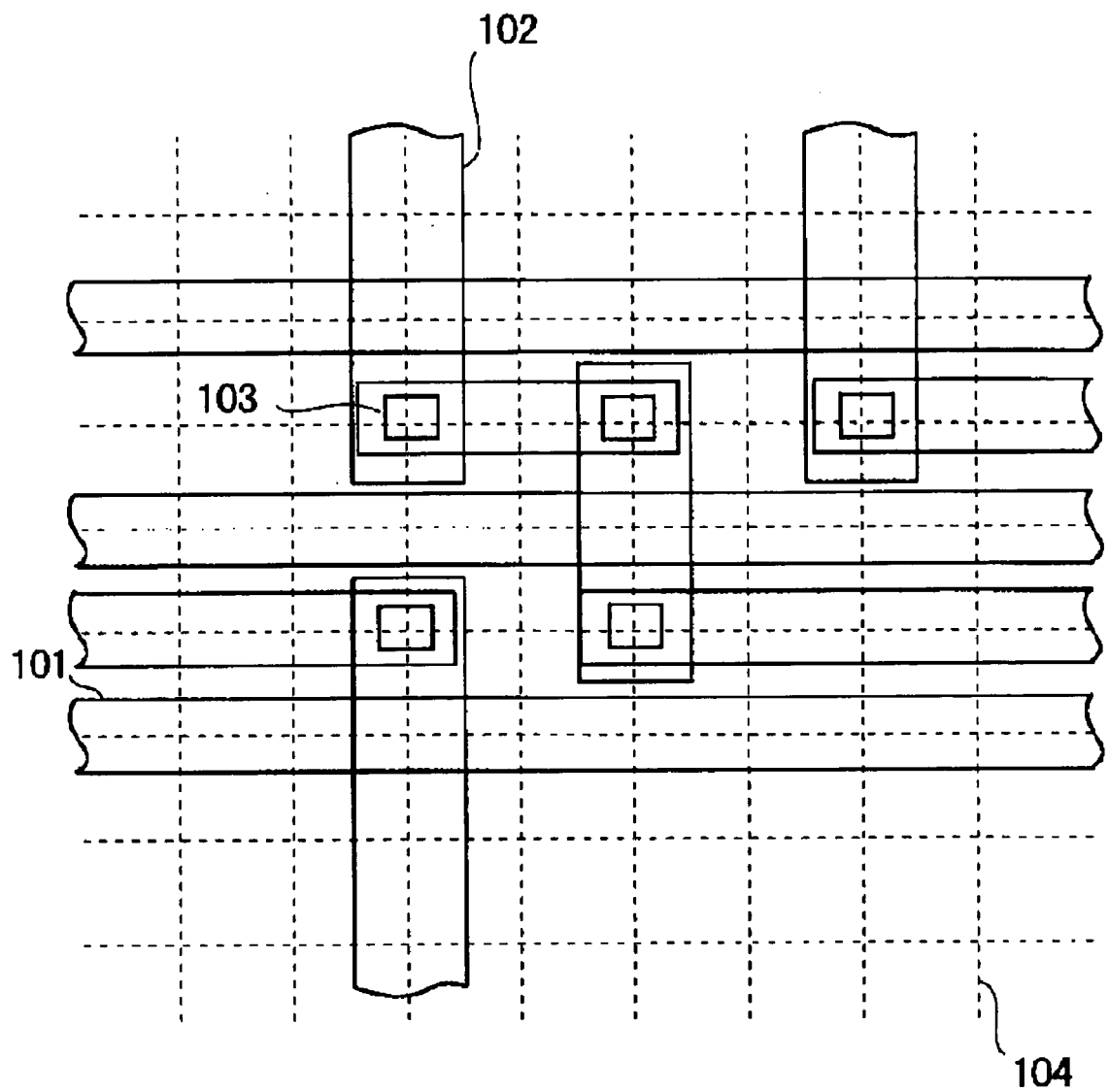
FIG. 6 illustrates an exemplary via placement in a layout of a conventional typical semiconductor device.

Referring to FIG. 5, the comparative example, to which the present invention is not applied, is described. In a placement region of via 103A interconnecting a conductor 101A on a routing channel $104_3$ and an upper layer conductor 102A, metals on both longitudinal sides of the conductor 101A, is protruded by 0.01 µm. If a conductor is laid on the routing channel $104_3$, the line spacing is 0.2−0.01=0.19 µm, thus violating the minimum spacing constraint.

For this reason, a conductor 101B neighboring to the conductor 101A is laid, using a routing channel $104_1$. That is, no conductor is laid on a routing channel $104_2$. In a via 103C (interconnecting the conductor 101D and the upper layer conductor 102C) and in via 103E (interconnecting the conductor 101E and the upper layer conductor 102D), metals are protruded on both longitudinal sides of the 101D and 101E, such that, if a conductor is laid on the routing channel $104_5$, the minimum spacing constraint is not met. Thus, no conductor is laid on the routing channel $104_5$. According to the present invention, a conductor 101G is laid on the routing channel $104_5$ neighboring to the routing channel $104_6$ on which is laid the conductor 101E.

According to the present invention, the routing channels may be effectively exploited to improve the interconnect efficiency, as the design reference is met.

Although an example of the masterslice type interconnection, laying the interconnect layers on a lattice of routing channels, has been described in the above embodiment the present invention is, of course, not limited to the layout of the above system. On the other hand, if there is allowance in a line spacing as compared with the preset minimum spacing constraint, and the minimum spacing constraint may be met by suitably shifting the center points of the vias with respect to the neighboring conductor, such as to meet the constraint, it is not mandatory that the lateral edge of the metal in the via region is aligned with the lateral edge of the conductor The present invention also is not limited to a case where the upper layer conductor is broader in width than the lower layer conductor. That is, the present invention may be applied to any via placements where a via in question is broader in width than the conductor on which the via is placed.

In the present embodiment, the spacing (pitch) in the routing channel lattice is uniform at least in a preset region including the via arranged in accordance with the present invention. However, the present invention may, of course, be applied to the interconnection with the non-uniform pitch.

Although the present invention has been explained with reference to a preferred embodiment thereof, it is to be noted that the present invention is not limited to the arrangement of the particular embodiment and may include various changes or corrections that may readily occur to those skilled in the art within the scope of the invention as defined in the claims.

The meritorious effects of the present invention are summarized as follows.

The present invention, described above, is designed to cope with a case where the width of the via for interconnecting the upper layer conductor and the lower layer conductor is not less than the width of the lower layer conductor, and where, if the center of the via is arranged on the center axis along the longitudinal direction of the lower layer conductor, the minimum spacing from the neighboring routing channel cannot be maintained, by arranging the center point of the via on the lower layer conductor with an offset relative to the center axis along the longitudinal direction of the lower layer conductor, such as to provide the spacing not less than the minimum spacing between the neighboring conductor, thereby improving the freedom and efficiency in placement and routing accompanied with connections between the interconnect layers.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device, comprising:
a first conductor provided in a first layer;
a second conductor provided in a second layer different from said first layer; and
a via interconnecting said first conductor and said second conductor;
wherein the via has a width that is not less than a line width of said first conductor;
wherein a center point of said via is arranged at a location having a preset offset from a longitudinal center axis of the first conductor;
wherein a placement region of said via has a side edge aligned with a longitudinal side edge of said first conductor; and
wherein the line width of said first conductor is not larger than a line width of said second conductor.

2. A semiconductor device, comprising:
a first conductor provided in a first layer;
a second conductor provided in a second layer different from said first layer; and
a via interconnecting said first conductor and said second conductor;
wherein the via has a width that is not less than a line width of said first conductor;
wherein a center point of said via is arranged at a location having a preset offset from a longitudinal center axis of the first conductor;
wherein a placement region of said via side edge aligned with a longitudinal side edge of said first conductor; and
wherein said first layer is a layer lower than the second layer.

3. The semiconductor device as defined in claim 2, wherein a spacing not less than a preset minimum spacing is provided between said first conductor inclusive of a placement region of said via and a third conductor arranged in the first layer and laid on a particular routing channel neighboring a routing channel on which said first conductor is laid.

4. The semiconductor device as defined in claim 2, wherein said via is arranged with said preset offset along a direction perpendicular to the longitudinal center axis of said first conductor and said via maintains a preset minimum spacing with respect to a third conductor provided in the first layer and neighboring said first conductor.

5. A method of performing layout of a semiconductor device using a computer, said method comprising:
reading circuit connection information for said semiconductor device from a first storage unit;
reading design constraint information for said semiconductor device from a second storage unit;
determining whether or not, in case said circuit connection information specifies a via interconnecting a first conductor arranged in a first layer and a second conductor arranged in a second layer different from said first layer, a width of said via is equal to or larger than a line width of said first conductor;
determining whether or not, in case said circuit connection information specifies a third conductor to be laid in a particular routing channel neighboring a routing channel in which said first conductor is to be laid and it is determined that the width of said via is equal to or larger than the line width of said first conductor, a spacing between said first conductor including said via and said third conductor satisfies a preset minimum spacing constraint specified by said design constraint information; and
providing, in case it is determined that said minimum spacing constraint is not satisfied, a placement of said via such that a center point of said via is offset a preset amount from a longitudinal center axis of said first conductor.

6. The method as defined in claim 5, wherein said step of providing comprises:
providing, in case it is determined that said minimum spacing constraint is not satisfied, said placement of said via such that said center point of said via is offset said preset amount along a direction perpendicular to the longitudinal center axis of said first conductor.

7. The method as defined in claim 5, wherein said first layer is lower than the second layer.

8. The method as defined in claim 5, wherein said line width of said first conductor is not larger than a line width of said second conductor.

9. The method as defined in claim 5, wherein a placement region of said via has a side edge aligned with one longitudinal side edge of said first conductor.

10. The method of claim 5, wherein said second storage unit is the same as said first storage unit.

11. The method of claim 5, further comprising:
providing, in case it is determined that said minimum spacing constraint is satisfied, said placement of said via such that said center point of said via is arranged on said longitudinal center axis of said first conductor.

12. The method of claim 5, further comprising:
providing, in case it is determined that the width of said via is not equal to or larger than the line width of said first conductor, said placement of said via such that said center point of said via is arranged on said longitudinal center axis of said first conductor.

13. A layout apparatus for performing placement and routing of a semiconductor device, said apparatus comprising:
a storage device storing circuit connection information and design constraint information for said semiconductor device;
a reading unit for reading the circuit connection information and the design constraint information from said storage device; and
a processing unit;
wherein said processing unit is configured to determine, in case said circuit connection information read by said reading unit specifies a via interconnecting a first conductor arranged in a first layer and a second conductor arranged in a second layer different from said first layer, whether a width of said via is equal to or larger than a line width of said first conductor;
wherein said processing unit is configured to determine, in case said circuit connection information specifies a third conductor to be laid in a particular routing channel neighboring a routing channel in which said first conductor is to be laid and said processing unit determines that the width of said via is equal to or larger than the line width of said first conductor, whether a spacing between said first conductor including said via and said third conductor satisfies a preset minimum spacing constraint specified by said design constraint information; and
wherein said processing unit is configured to provide, in case said processing unit determines that said minimum spacing constraint is not satisfied, a placement of said via such that a center point of said via is offset a preset amount from a longitudinal center axis of said first conductor.

14. The layout apparatus according to claim 13,
wherein said processing unit is configured to provide, in case said processing unit determines that said minimum spacing constraint is not satisfied, said placement of said via such that said center point of said via is offset said preset amount in a direction perpendicular to the longitudinal center axis of said first conductor.

15. The layout apparatus as defined in claim 13,
wherein said first layer is a layer lower than the second layer.

16. The layout apparatus as defined in claim 13,
wherein said line width of said first conductor is not larger than a line width of said second conductor.

17. The layout apparatus as defined in claim 13,
wherein said processing unit is configured to provide, in case said processing unit determines that said minimum spacing constraint is not satisfied, said placement of said via such that said via has a lateral edge aligned with one longitudinal lateral edge of said first conductor.

18. A storage medium storing a computer program which when executed causes a computer to perform a process for placement and routing of a semiconductor device, said process comprising:
reading circuit connection information and design constraint information for the semiconductor device from a storage device;
determining, in case said circuit connection information specifies a via interconnecting a first conductor arranged in a first layer and a second conductor arranged in a second layer different from said first layer, whether a width of said via is equal to or larger than a line width of said first conductor;
determining, in case said circuit connection information specifies a third conductor to be laid in a particular routing channel neighboring a routing channel in which said first conductor is to be laid and it is determined that the width of said via is equal to or larger than the line width of said first conductor, whether a spacing between said first conductor including said via and said third conductor satisfies a preset minimum spacing constraint specified by said design constraint information; and
providing, in case it is determined that said minimum spacing constraint is not satisfied, a placement of said via such that a center point of said via is offset a preset amount from a longitudinal center axis of said first conductor.

19. The storage medium according to claim 18,
wherein, in case it is determined that said minimum spacing constraint is not satisfied, said via is arranged with said offset of the center point in a direction perpendicular to the longitudinal center axis of said first conductor.

20. The storage medium as defined in claim 18,
wherein said first layer is a layer lower than the second layer.

21. The storage medium as defined in claim 18,
wherein said line width of said first conductor is not larger than a line width of said second conductor.

22. The storage medium as defined in claim 18,
wherein a placement region of said via has a lateral edge aligned with one longitudinal side edge of said first conductor.

23. A method for performing a layout of a semiconductor device, said method comprising:
arranging a first conductor in a first layer and a second conductor in a second layer different from said first layer; and
arranging a via interconnecting said first conductor and the second conductor;
wherein the via has a width that is not less than a line width of said first conductor;
wherein a center point of said via is arranged at a location having a preset offset from a longitudinal center axis of the first conductor;
wherein a placement region of said via has a side edge aligned with a longitudinal side edge of said first conductor; and
wherein said first layer is a layer lower than the second layer.

24. The method of claim 23,
wherein, if said width of said via is less than a line width of said first conductor, said center point of said via is arranged on said longitudinal center axis of said first conductor.

* * * * *